United States Patent
Lee et al.

(10) Patent No.: US 7,580,295 B2
(45) Date of Patent: Aug. 25, 2009

(54) SEMICONDUCTOR MEMORY DEVICE AND MEMORY SYSTEM INCLUDING SEMICONDUCTOR MEMORY DEVICE

(75) Inventors: Kwang-jin Lee, Hwaseong-si (KR); Woo-yeong Cho, Suwon-si (KR); Hye-jin Kim, Gangnam-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 11/850,128

(22) Filed: Sep. 5, 2007

(65) Prior Publication Data

US 2008/0068897 A1    Mar. 20, 2008

(30) Foreign Application Priority Data

Sep. 19, 2006    (KR)    ........................ 10-2006-0090739

(51) Int. Cl.
  *G11C 7/00*    (2006.01)
(52) U.S. Cl. ............................. 365/189.02; 365/189.05; 365/185.08; 365/185.15; 365/230.01; 365/185.05
(58) Field of Classification Search ............ 365/189.02, 365/189.05, 185.08, 185.18, 230.1
See application file for complete search history.

(56) References Cited

U.S. PATENT DOCUMENTS

| | | | | |
|---|---|---|---|---|
| 5,856,989 A | * | 1/1999 | Oldfield et al. | ............. 714/801 |
| 6,990,044 B2 | * | 1/2006 | Kang | .......................... 365/235 |
| 7,000,846 B2 | * | 2/2006 | Hakushi et al. | ............. 235/492 |
| 2006/0059320 A1 | * | 3/2006 | Akizuki | ....................... 711/158 |
| 2008/0291727 A1 | * | 11/2008 | Seo et al. | ............... 365/185.08 |

FOREIGN PATENT DOCUMENTS

| | | |
|---|---|---|
| JP | 10283256 A | 10/1998 |
| JP | 2004213337 A | 7/2004 |
| JP | 2006059046 A | 3/2006 |
| KR | 19930020465 | 10/1993 |
| KR | 1020010035775 A | 5/2001 |
| KR | 1020040084288 A | 10/2004 |
| KR | 2004355689 A | 12/2004 |
| KR | 1020050079030 A | 8/2005 |

* cited by examiner

*Primary Examiner*—Connie C Yoha
(74) *Attorney, Agent, or Firm*—Volentine & Whitt, PLLC (57) ABSTRACT

A semiconductor memory device comprises a memory cell array comprising memory cells of a first type. The memory cell array performs write and read operations in response to signals designed for the operation of a memory cell array comprising memory cells of a type other than the first type.

15 Claims, 11 Drawing Sheets

| 100_1 | 100_2 | 100_3 | 100_4 | 100_5 | 100_6 | 100_7 | 100_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(400_1) || SA/WD(400_2) || SA/WD(400_3) || SA/WD(400_4) ||
| PERIPHERY(500) |||||||||
| SA/WD(400_8) || SA/WD(400_7) || SA/WD(400_6) || SA/WD(400_5) ||
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 100_16 | 100_15 | 100_14 | 100_13 | 100_12 | 100_11 | 100_10 | 100_9 |

SEMICONDUCTOR MEMORY DEVICE AND MEMORY SYSTEM INCLUDING SEMICONDUCTOR MEMORY DEVICE

CROSS-REFERENCE TO RELATED APPLICATION

This application claims the priority of Korean Patent Application No. 10-2006-0090739, filed on Sep. 19, 2006, the disclosure of which is hereby incorporated by reference in its entirety.

BACKGROUND OF THE INVENTION

1. Field of the Invention

Embodiments of the invention relate generally to semiconductor memory devices and a memory systems including semiconductor memory devices. More particularly, embodiments of the invention relate to semiconductor memory devices and related systems having improved operating speed and reliability relative to conventional devices and systems.

2. Description of Related Art

Nearly all modern electronic devices include some form of volatile or nonvolatile semiconductor memory. Examples of volatile semiconductor memories include dynamic random access memory (DRAM) and static random access memory (SRAM), and examples of nonvolatile semiconductor memories include NOR flash memory, NAND flash memory, and phase change random access memory (PRAM).

In general, volatile memories tend to be cheaper, faster, and more densely integrated than nonvolatile memories. However, volatile memories lose stored data when disconnected from an external power source. As a result, nonvolatile memories are becoming an increasingly popular choice for providing data storage in a number of contemporary devices such as portable electronic devices.

Because of the increasing popularity of nonvolatile memories, significant efforts have been dedicated to improving the performance and reliability of nonvolatile memories.

SUMMARY OF THE INVENTION

Embodiments of the invention provide semiconductor memory devices and systems having improved operating speed and reliability relative to conventional semiconductor memory devices and systems.

According to one embodiment of the present invention, a semiconductor memory device comprises a memory cell array comprising a plurality of first-type memory cells, an interface module, and a write/read circuit module. The interface module receives a second-type command signal, a second-type address signal, and a second-type data signal that are suitable for operating a semiconductor memory device comprising a plurality of second-type memory cells, and respectively converts the second-type command signal, the second-type address signal, and the second-type data signal into a first-type command signal, a first-type address signal, and a first-type data signal that are suitable for operating a semiconductor memory device comprising the first-type memory cells. The write/read circuit module writes data to or reads data from the memory cell array using the first-type command signal, the first-type address signal, and the first-type data signal.

In general, the first-type may comprise, for example, PRAM, and the second-type may comprise, for example, SRAM, DRAM, or flash. In other words, the first-type memory cells may comprise, e.g., PRAM cells and the second-type signals may comprise, e.g., SRAM signals, DRAM signals, or flash signals.

According to another embodiment of the invention, a memory system comprises first through m-th controllers, among which is an n-th controller ($1 \leq n \leq m$), the n-th controller providing a second-type command signal, a second-type address signal, and a second-type data signal that are suitable for operating a semiconductor memory device comprising a plurality of second-type memory cells, and first through m-th semiconductor memory devices respectively corresponding to the first through m-th controllers, among which is an n-th semiconductor memory device corresponding to the n-th controller, the n-th semiconductor memory device operating in response to the second-type command signal, the second-type address signal, and the second-type data signal. The n-th semiconductor memory device comprises a memory cell array comprising a plurality of first-type memory cells, an interface module, and a write/read circuit module. The interface module receives the second-type command signal, the second-type address signal, and the second-type data signal and respectively converts the second-type command signal, the second-type address signal, and the second-type data signal into a first-type command signal, a first-type address signal, and a first-type data signal that are suitable for operating a semiconductor memory device comprising the first-type memory cells. The write/read circuit module writes data to or reads data from the memory cell array using the first-type command signal, the first-type address signal, and the first-type data signal.

BRIEF DESCRIPTION OF THE DRAWINGS

Embodiments of the invention are described below in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples while the actual scope of the invention is defined by the claims that follow.

Figure 1:
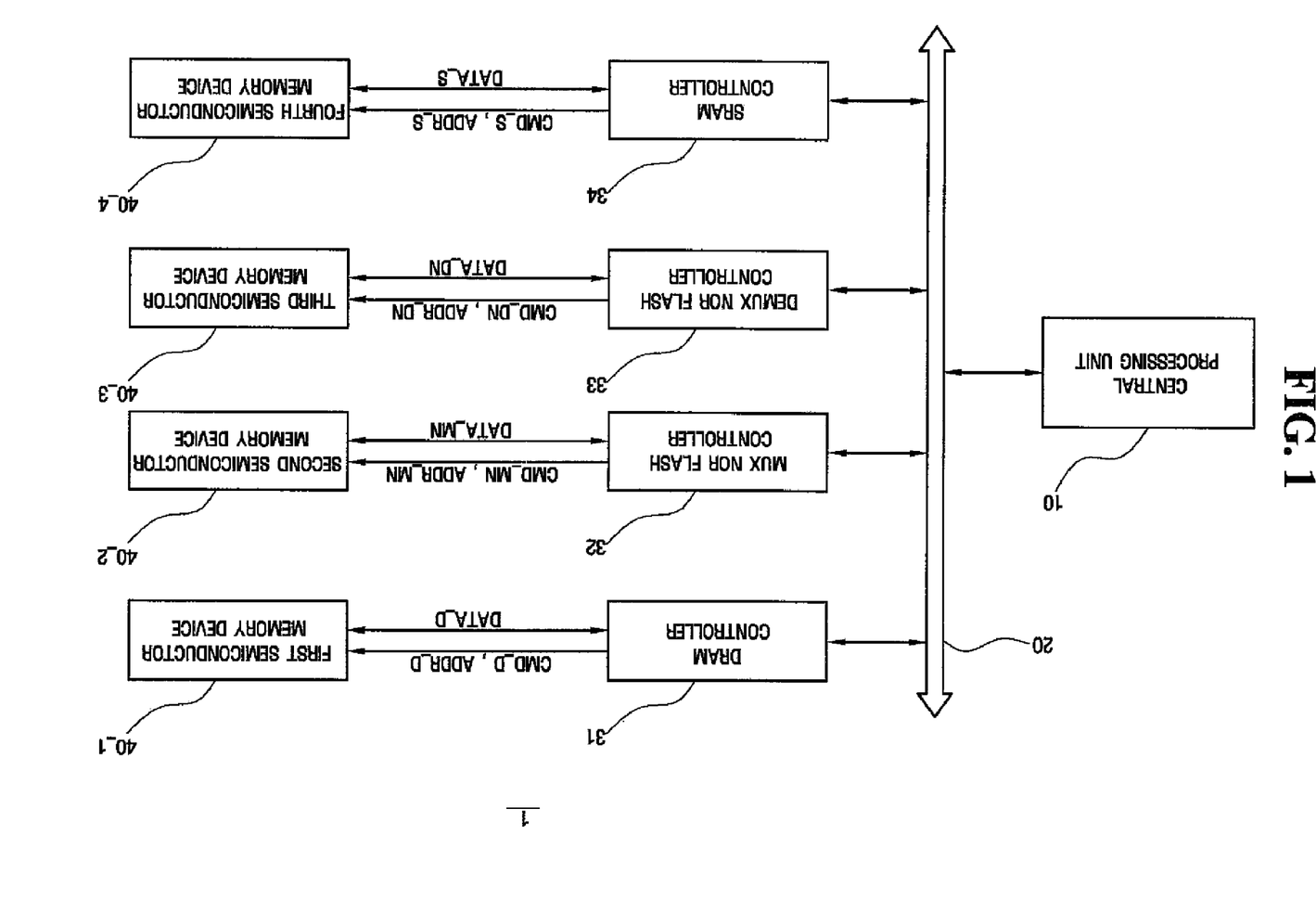
FIG. 1 is a block diagram of a memory system according to an embodiment of the invention.

FIG. 1 is a block diagram of a memory system according to an embodiment of the present invention. As examples, the memory system illustrated in FIG. 1 could comprise a personal communication system, a portable computer, a personal data assistant (PDA), an MPEG Layer 3 (MP3) player, or a digital camera.

The memory system of FIG. 1 comprises a dynamic random access memory (DRAM) controller, a MUX NOR flash memory controller, a DEMUX NOR flash memory controller, and a static random access memory (SRAM) controller; however, the memory system could be modified in a variety of ways without departing from the scope of the invention. For example, the system could be modified to include only one of a dynamic random access memory (DRAM) controller, a MUX NOR flash memory controller, a DEMUX NOR flash memory controller, and a static random access memory (SRAM) controller. In addition, the system could be modified to use a NAND flash memory controller.

Referring to FIG. 1, a memory system 1 comprises a central processing unit 10, a system bus 20, a DRAM controller 31, a MUX NOR flash controller 32, a DEMUX NOR flash controller 33, an SRAM controller 34, and first through fourth semiconductor memory devices 40_1, 40_2, 40_3, and 40_4 respectively connected to DRAM controller 31, MUX NOR flash controller 32, DEMUX NOR flash controller 33, and SRAM controller 34.

MUX NOR flash controller 32 comprises a NOR flash memory receiving an address signal and a data signal via the same input/output (I/O) pins during a write operation, i.e., a NOR flash memory receiving an address signal and a data signal that are multiplexed. DEMUX NOR flash controller 33 comprises a NOR flash memory receiving an address signal and a data signal via different I/O pins, i.e., a NOR flash memory receiving an address signal and a data signal that are not multiplexed.

Central processing unit 10 controls DRAM controller 31, MUX NOR flash controller 32, DEMUX NOR flash controller 33, and SRAM controller 34 via system bus 20, and performs signal processing and other computations.

In order to write/read data to/from first semiconductor memory device 40_1, DRAM controller 31 transmits a DRAM command signal CMD_D and a DRAM address signal ADDR_D to first semiconductor memory device 40_1 and/or transmits/receives a DRAM data signal DATA_D to/from first semiconductor memory device 40_1 under the control of central processing unit 10. DRAM command signal CMD_D, DRAM address signal ADDR_D, and DRAM data signal DATA_D are suitable for the operation of a semiconductor memory device comprising DRAM cells. DRAM command signal CMD_D may include, for example, a chip selection signal CS, a row strobe signal /RAS, a column strobe signal /CAS, and a write enable signal /WE. DRAM address signal ADDR_D may include, for example, a row address signal and a column address signal multiplexed together.

In order to write/read data to/from the second semiconductor memory device 40_2, MUX NOR flash controller 32 transmits a MUX NOR command signal CMD_MN and a MUX NOR address signal ADDR_MN to second semiconductor memory device 40_2 and/or transmits/receives a MUX NOR data signal DATA_MN to/from second semiconductor memory device 40_2 under the control of central processing unit 10. MUX NOR command signal CMD_MN, MUX NOR address signal ADDR_MN, and MUX NOR data signal DATA_MN are suitable for the operation of a semiconductor memory device comprising MUX NOR memory cells. MUX NOR command signal CMD_MN may include, for example, a chip selection signal CS, a write enable signal /WE, and a valid address signal /AVD. MUX NOR address signal ADDR_MN and MUX NOR data signal DATA_MN may be multiplexed together.

In order to write/read data to/from third semiconductor memory device 40_3, DEMUX NOR flash controller 33 transmits a DEMUX NOR command signal CMD_DN and a DEMUX NOR address signal ADDR_DN to third semiconductor memory device 40_3 and/or transmits/receives a DEMUX NOR data signal DATA_DN to/from third semiconductor memory device 40_3 under the control of central processing unit 10. DEMUX NOR command signal CMD_DN, DEMUX NOR address signal ADDR_DN, and DEMUX NOR data signal DATA_DN are suitable for the operation of a semiconductor memory device comprising DEMUX NOR memory cells.

In order to write/read data to/from fourth semiconductor memory device 40_4, SRAM controller 34 transmits a SRAM command signal CMD_S and a SRAM address signal ADDR_S to fourth semiconductor memory device 40_4 and/or transmits/receives a SRAM data signal DATA_S to/from fourth semiconductor memory device 40_4 under the control of central processing unit 10. SRAM command signal CMD_S SRAM address signal ADDR_S, and SRAM data signal DATA_S are suitable for the operation of a semiconductor memory device comprising SRAM cells.

First through fourth semiconductor memory devices 40_1 through 40_4 respectively correspond to DRAM controller 31, MUX NOR flash controller 32, DEMUX NOR flash controller 33, and SRAM controller 34. Each of first through fourth semiconductor memory devices 40_1 through 40_4 receives various signals from a corresponding controller and operates in response to the signals.

Each of first through fourth semiconductor memory devices 40_1 through 40_4 comprises a memory cell array comprising a plurality of PRAM cells and an interface module. The interface module performs a unified interface function to convert DRAM signals CMD_D, ADDR_D, and DATA_D, SRAM signals CMD_S, ADDR_S, and DATA_S, MUX NOR signals CMD_MN, ADDR_MN, and DATA_MN, and DEMUX NOR signals CMD_DN, ADDR_DN, and DATA_DN into PRAM signals CMD_P, ADDR_P, and DATA_P suitable for the operation of a semiconductor memory device comprising PRAM cells. Accordingly, memory system 1 can use PRAMs instead of DRAMs, SRAMs, or flash memories without replacing the controllers in memory system 1. In other words, a system designed to include several different types of semiconductor chips can be modified to use a single type of semiconductor chip, thereby reducing the price and development cost of the system.

Figure 2:
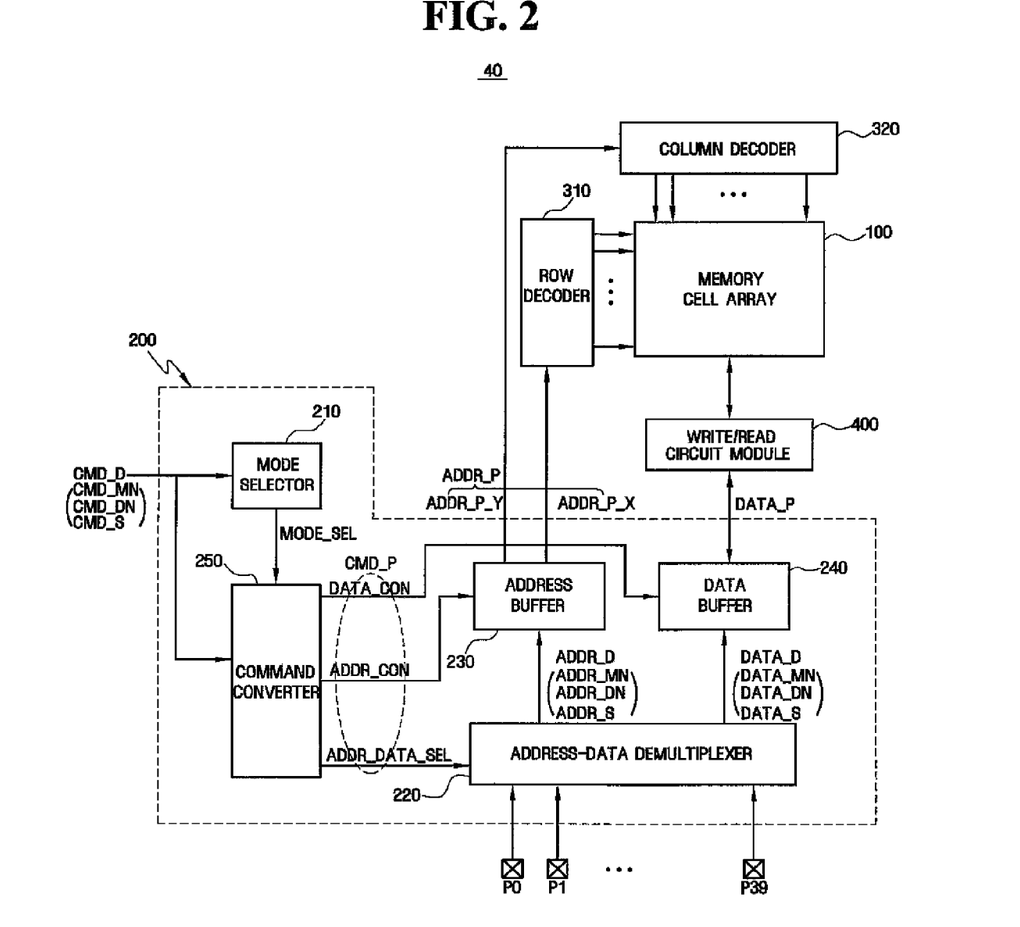
FIG. 2 is a block diagram of a semiconductor memory device according to an embodiment of the present invention.

FIG. 2 is a block diagram illustrating an example of one way to implement first through fourth semiconductor memory devices 40_1 through 40_4 in accordance with an embodiment of the present invention.

Referring to FIG. 2, a semiconductor memory device 40 comprises a memory cell array 100, an interface module 200, a row decoder 310, a column decoder 320, and a write/read circuit module 400.

Memory cell array 100 comprises a plurality of PRAM cells each including a phase-change material. The phase change material typically comprises a compound including germanium (Ge), antimony (Sb), and tellurium (Te), i.e., a "GST" compound. The GST compound is well suited for a PRAM because it can quickly transition between amorphous and crystalline states by heating and cooling. Examples of other compounds that could be used for the phase-change material include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb(SeTe), and $Te_{81}Ge_{15}Sb_2S_2$.

Interface module 200 receives DRAM signals CMD_D, ADDR_D, and DATA_D, SRAM signals CMD_S, ADDR_S, and DATA_S, MUX NOR signals CMD_MN, ADDR_MN, and DATA_MN, or DEMUX NOR signals CMD_DN, ADDR_DN, and DATA_DN via a plurality of I/O pins P0 through P39. Interface module 200 respectively converts DRAM signals CMD_D, ADDR_D, and DATA_D, SRAM signals CMD_S, ADDR_S, and DATA_S, MUX NOR signals CMD_MN, ADDR_MN, and DATA_MN, or DEMUX NOR signals CMD_DN, ADDR_DN, and DATA_DN into a PRAM command signal CMD_P, a PRAM address signal ADDR_P, and a PRAM data signal DATA_P.

For example, where DRAM address signal ADDR_D into which a DRAM row address signal and a DRAM column address signal are multiplexed is provided by DRAM controller 31, interface module 200 obtains the DRAM row address signal and the DRAM column address signal by demultiplexing DRAM address signal ADDR_D, and respectively converts the DRAM row address signal and the DRAM column address signal into a PRAM row address signal ADDR_P_X and a PRAM column address signal ADDR_P_Y by buffering the DRAM row address signal and the DRAM column address signal.

Where MUX NOR address signal ADDR_MN and MUX NOR data signal DATA_MN that are multiplexed together are provided by MUX NOR flash controller 32, interface module 200 demultiplexes MUX NOR address signal ADDR_MN and MUX NOR data signal DATA_MN, and respectively converts demultiplexed MUX NOR address signal ADDR_MN and demultiplexed MUX NOR data signal DATA_MN into a PRAM address signal ADDR_P and a PRAM data signal DATA_P by buffering demultiplexed MUX NOR address signal ADDR_MN and demultiplexed MUX NOR data signal DATA_MN.

Where DEMUX NOR address signal ADDR_DN and DEMUX NOR data signal DATA_DN are provided by DEMUX NOR flash controller 33, interface module 200 respectively converts DEMUX NOR address signal ADDR_DN and DEMUX NOR data signal DATA_DN into a PRAM address signal ADDR_P and a PRAM data signal DATA_P by buffering DEMUX NOR address signal ADDR_DN and DEMUX NOR data signal DATA_DN.

Where SRAM address signal ADDR_S and SRAM data signal DATA_S are provided by SRAM controller 34, interface module 200 respectively converts SRAM address signal ADDR_S and SRAM data signal DATA_S into a PRAM address signal ADDR_P and a PRAM data signal DATA_P by buffering SRAM address signal ADDR_S and SRAM data signal DATA_S.

Interface module 200 comprises a mode selector 210, a command converter 250, an address-data demultiplexer 220, an address buffer 230, and a data buffer 240.

Mode selector 210 provides command converter 250 with a plurality of interface mode signals MODE_SEL respectively corresponding to DRAM command signal CMD_D, MUX NOR command signal CMD_MN, DEMUX NOR command signal CMD_DN, and SRAM command signal CMD_S. For example, where mode selector 210 receives DRAM command signal CMD_D, mode selector 210 provides a first interface mode signal MODE_SEL having a logic value "00" to command converter 250. Where mode selector 210 receives MUX NOR command signal CMD_MN, mode selector 210 provides a second interface mode signal MODE_SEL having a logic value "01" to command converter 250. Where mode selector 210 receives DEMUX NOR command signal CMD_DN, mode selector 210 provides a third interface mode signal MODE_SEL having a logic value "10" to command converter 250. Where mode selector 210 receives SRAM command signal CMD_S, mode selector 210 provides a fourth interface mode signal MODE_SEL having a logic value "11" to command converter 250.

Command converter 250 receives one of first through fourth interface mode signals MODE_SEL, converts the corresponding command signal among signals CMD_D, CMD_MN, CMD_DN, and CMD_S into PRAM command signal CMD_P, and outputs PRAM command signal CMD_P. PRAM command signal CMD_P comprises first through third control signals ADDR_DATA_SEL, ADDR_CON, and DATA_CON.

First control signal ADDR_DATA_SEL controls address-data demultiplexer 220, second control signal DATA_CON controls address buffer 230, and third control signal ADDR_CON controls data buffer 240. In addition, command converter 250 may output additional control signals (not shown) to control other functional blocks such as row decoder 310, column decoder 320, and write/read circuit module 400.

Address-data demultiplexer 220 receives address signals ADDR_D, ADDR_MN, ADDR_DN, and ADDR_S and data signals DATA_D, DATA_MN, DATA_DN, and DATA_S via I/O pins P0 through P39, and selectively demultiplexes address signals ADDR_D, ADDR_MN, ADDR_DN, and ADDR_S and data signals DATA_D, DATA_MN, DATA_DN, and DATA_S, transmits address signals ADDR_D, ADDR_MN, ADDR_DN, and ADDR_S to address buffer 230, and transmits data signals DATA_D, DATA_MN, DATA_DN, and DATA_S to data buffer 240 in response to first control signal ADDR_DATA_SEL.

Address buffer 230 receives address signals ADDR_D, ADDR_MN, ADDR_DN, and ADDR_S transmitted by address-data demultiplexer 220, and converts address signals ADDR_D, ADDR_MN, ADDR_DN, and ADDR_S into PRAM address signals ADDR_P by buffering address signals ADDR_D, ADDR_MN, ADDR_DN, and ADDR_S in response to second control signal ADDR_CON.

Data buffer 240 receives data signals DATA_D, DATA_MN, DATA_DN, and DATA_S transmitted by address-data demultiplexer 220, and converts data signals DATA_D, DATA_MN, DATA_DN, and DATA_S into PRAM data signals DATA_P by buffering data signals DATA_D, DATA_MN, DATA_DN, and DATA_S in response to third control signal DATA_CON.

Figure 3:
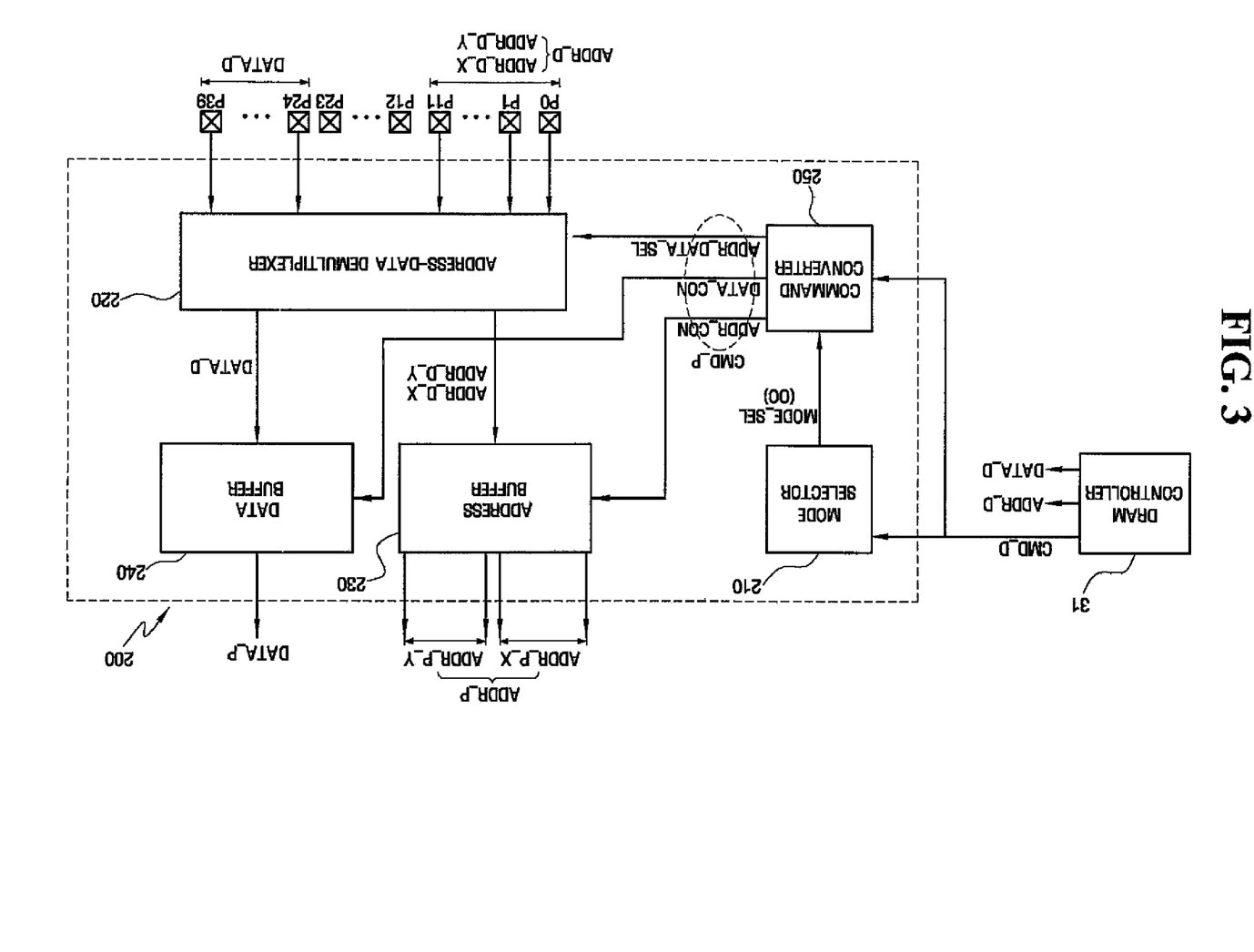
FIGS. 3 through 5 are block diagrams for explaining the operation of an interface module illustrated in FIG. 2.
Figure 4:
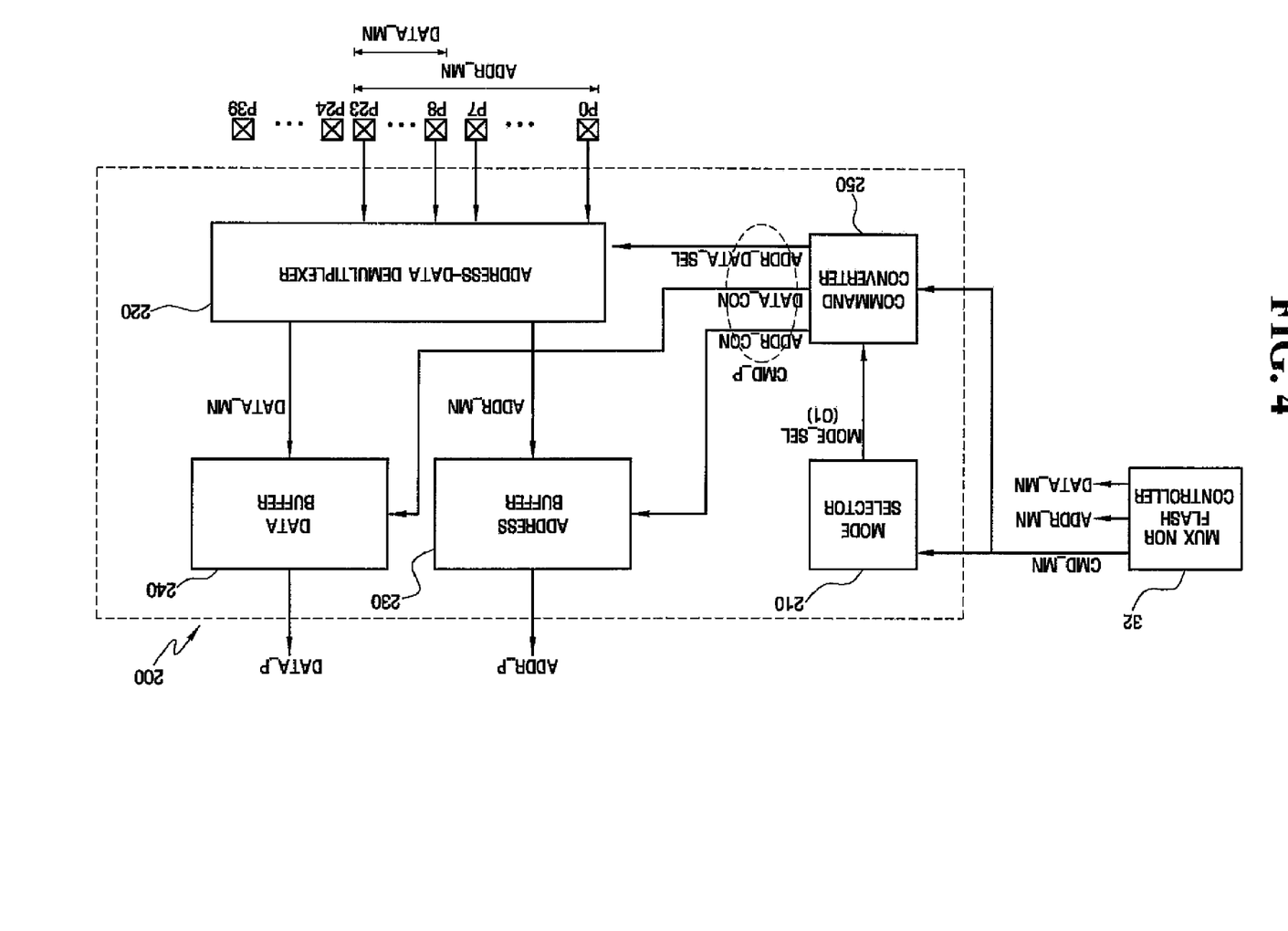
Figure 5:
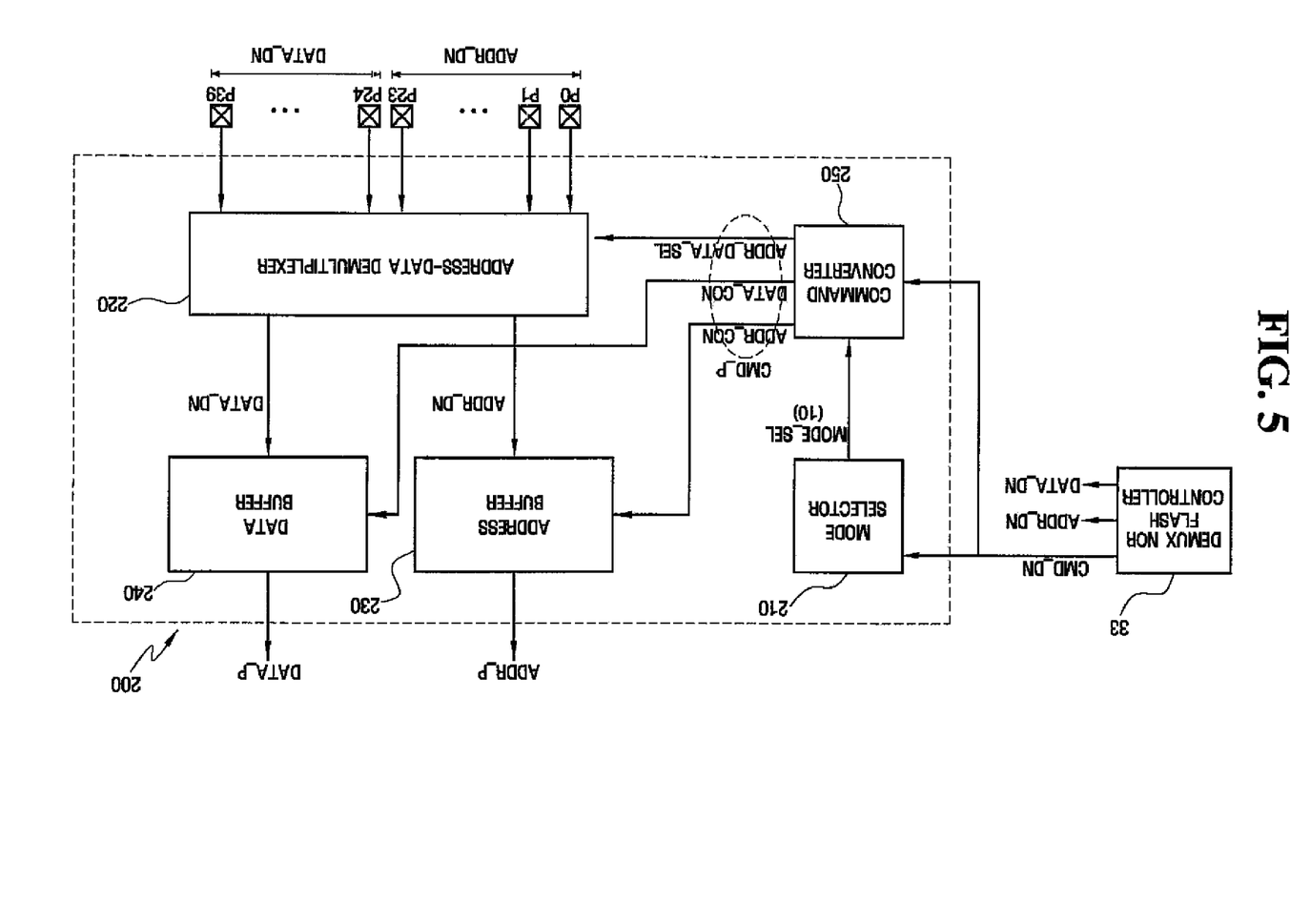

FIGS. 3 through 5 are block diagrams for explaining the operation of interface module 200 in further detail. More particularly, FIGS. 3 through 5 are used to further describe the operation of interface module 200 in connection with DRAM controller 31, MUX NOR flash controller 32, and DEMUX NOR flash controller 33, respectively. In the description that follows, it will be assumed that memory cell array 100 has a capacity of 256 megabytes (M).

Referring to FIG. 3, DRAM controller 31 generates DRAM command signal CMD_D, DRAM address signal ADDR_D, and DRAM data signal DATA_D. Interface module 200 respectively converts DRAM command signal CMD_D, DRAM address signal ADDR_D, and DRAM data signal DATA_D into PRAM command signal CMD_P, PRAM address signal ADDR_P, and PRAM data signal DATA_P.

Mode selector 210 provides command converter 250 with the first interface mode signal MODE_SEL corresponding to DRAM command signal CMD_D and having logic value "00". Command converter 250 provides address-data demultiplexer 220, address buffer 230, and data buffer 240 with first, second, and third control signals ADDR_DATA_SEL, ADDR_CON, and DATA_CON, respectively, which correspond to first interface signal MODE_SEL. In addition, command converter 250 may output additional control signals (not shown) to control other functional blocks.

Address-data demultiplexer 220 transmits DRAM address signal ADDR_D and DRAM data signal DATA_D to address buffer 230 and data buffer 240, respectively, in response to first control signal ADDR_DATA_SEL. Here, DRAM address signal ADDR_D is a signal into which a DRAM row address signal ADDR_D_X and a DRAM column address signal ADDR_D_Y are multiplexed, and DRAM row address signal ADDR_D_X and DRAM column address signal ADDR_D_Y may be sequentially input via twelve I/O pins (e.g., P0 through P11). Since DRAM address signal ADDR_D and DRAM data signal DATA_D are not multiplexed together and are input via different groups of I/O pins (e.g., P0 through P11 and P24 through P39), address-data demultiplexer 220 readily transmits DRAM address signal ADDR_D and DRAM data signal DATA_D to address buffer 230 and data buffer 240, respectively, without the need to demultiplex them.

Address buffer 230 obtains DRAM row address signal ADDR_D_X and DRAM column address signal ADDR_D_Y by demultiplexing DRAM address signal ADDR_D, and respectively converts DRAM row address signal ADDR_D_X and DRAM column address signal ADDR_D_Y into a PRAM row address signal ADDR_P_X and a PRAM column address signal ADDR_P_Y by buffering DRAM row address signal ADDR_D_X and DRAM column address signal ADDR_D_Y in response to second control signal ADDR_CON.

Data buffer 240 converts DRAM data signal DATA_D into a PRAM data signal DATA_P by buffering DRAM data signal DATA_D in response to third control signal DATA_CON.

Referring to FIG. 4, interface module 200 converts MUX NOR command signal CMD_MN, MUX NOR address signal ADDR_MN, and MUX NOR data signal DATA_MN into PRAM command signal CMD_P, PRAM address signal ADDR_P, and PRAM data signal DATA_P, respectively.

MUX NOR flash controller 32 provides MUX NOR command signal CMD_MN, MUX NOR address signal ADDR_MN, and MUX NOR data signal DATA_MN. Then, mode selector 210 provides command converter 250 with second interface mode signal MODE_SEL corresponding to MUX NOR command signal CMD_MN and having logic value of "01". Command converter 250 provides address-data demultiplexer 220, address buffer 230, and data buffer 240 with first, second, and third control signals ADDR_DATA_SEL, ADDR_CON, and DATA_CON, respectively, which correspond to second interface signal MODE_SEL. In addition, command converter 250 may output control signals (not shown) to control other functional blocks.

Address-data demultiplexer 220 demultiplexes MUX NOR address signal ADDR_MN and MUX NOR data signal DATA_MN, and transmits demultiplexed MUX NOR address signal ADDR_MN and demultiplexed MUX NOR data signal DATA_MN to address buffer 230 and data buffer 240, respectively, in response to first control signal ADDR_DATA_SEL. Here, MUX NOR address signal ADDR_MN may be input via twenty four I/O pins (e.g., P0 through P23), and MUX NOR data signal DATA_MN may be input via sixteen I/O pins (e.g., P8 through P23). In other words, MUX NOR address signal ADDR_MN and MUX NOR data signal DATA_MN may be both sequentially input via the sixteen I/O pins (e.g., P8 through P23). Accordingly, address-data demultiplexer 220 demultiplexes MUX NOR address signal ADDR_MN and MUX NOR data signal DATA_MN that are sequentially input.

Address buffer 230 converts demultiplexed MUX NOR address signal ADDR_MN into a PRAM address signal ADDR_P by buffering demultiplexed MUX NOR address signal ADDR_MN in response to second control signal ADDR_CON.

Data buffer 240 converts demultiplexed MUX NOR data signal DATA_MN into PRAM data signal DATA_P by buffering demultiplexed MUX NOR data signal DATA_MN in response to third control signal DATA_CON.

Referring to FIG. 5, interface module 200 converts DEMUX NOR command signal CMD_DN, DEMUX NOR address signal ADDR_DN, and DEMUX NOR data signal DATA_DN into PRAM command signal CMD_P, PRAM address signal ADDR_P, and PRAM data signal DATA_P, respectively.

DEMUX NOR flash controller 33 provides DEMUX NOR command signal CMD_DN, DEMUX NOR address signal ADDR_DN, and DEMUX NOR data signal DATA_DN. Mode selector 210 provides command converter 250 with third interface mode signal MODE_SEL corresponding to DEMUX NOR command signal CMD_DN and having logic value "10". Command converter 250 provides address-data demultiplexer 220, address buffer 230, and data buffer 240 with first, second, and third control signals ADDR_DATA_SEL, ADDR_CON, and DATA_CON, respectively, which correspond to third interface signal MODE_SEL. In addition, command converter 250 may output control signals (not shown) to control other functional blocks.

Address-data demultiplexer 220 transmits DEMUX NOR address signal ADDR_DN and DEMUX NOR data signal DATA_DN to address buffer 230 and data buffer 240, respectively, in response to first control signal ADDR_DATA_SEL. DEMUX NOR address signal ADDR_DN may be input via twenty four I/O pins (e.g., P0 through P23), and DEMUX NOR data signal DATA_DN may be input via remaining sixteen I/O pins (e.g., P24 through P39).

Since DEMUX NOR address signal ADDR_DN and DEMUX NOR data signal DATA_DN are not multiplexed and are input via different groups of I/O pins (e.g., P0 through P23 and P24 through P39), address-data demultiplexer 220 readily transmits DEMUX NOR address signal ADDR_DN and DEMUX NOR data signal DATA_DN to address buffer 230 and data buffer 240, respectively, without the need to demultiplex these signals.

Address buffer 230 converts DEMUX NOR address signal ADDR_MN into PRAM address signal ADDR_P by buffering DEMUX NOR address signal ADDR_MN in response to second control signal ADDR_CON. Data buffer 240 converts DEMUX NOR data signal DATA_DN into PRAM data signal DATA_P by buffering DEMUX NOR data signal DATA_DN in response to third control signal DATA_CON.

The operation of interface module 200 in connection with SRAM controller 34 illustrated in FIG. 1 is similar to the operation of interface module 200 in connection with DEMUX NOR flash controller 33. In particular, SRAM address signal ADDR_S is input via twenty four I/O pins (e.g., P0 through P23), and SRAM data signal DATA_S is input via the remaining sixteen I/O pins (e.g., P24 through P39). Mode selector 210 provides command converter 250 with fourth interface mode signal MODE_SEL corresponding to SRAM command signal CMD_S and having logic value "11".

Command converter 250 provides address-data demultiplexer 220, address buffer 230, and data buffer 240 with first through third control signals ADDR_DATA_SEL, ADDR_CON, and DATA_CON, respectively, which correspond to fourth interface signal MODE_SEL. Address-data demultiplexer 220 transmits SRAM address signal ADDR_S and SRAM data signal DATA_S to address buffer 230 and data buffer 240, respectively. Address buffer 230 converts SRAM address signal ADDR_S into a PRAM address signal ADDR_P by buffering SRAM address signal ADDR_S, and data buffer 240 converts SRAM data signal DATA_S into a PRAM data signal DATA_P by buffering SRAM data signal DATA_S.

An interface module connected to a NAND flash controller may operate using mechanism similar to that of interface module 200. In other words, a NAND flash controller (not shown) may provide a NAND command signal, a NAND address signal, and a NAND data signal suitable for the operation of a semiconductor memory device comprising NAND memory cells. An interface module (not shown) connected to the NAND flash controller may sequentially receive the NAND command signal, the NAND address signal, and the NAND data signal via, for example, eight I/O pins. Then, the interface module may demultiplex the NAND command signal, the NAND address signal, and the NAND data signal, and convert the demultiplexed NAND command signal, the demultiplexed NAND address signal, and the demultiplexed NAND data signal into PRAM command signal CMD_P, PRAM address signal ADDR_P, and PRAM data signal DATA_P, respectively.

Figure 6:
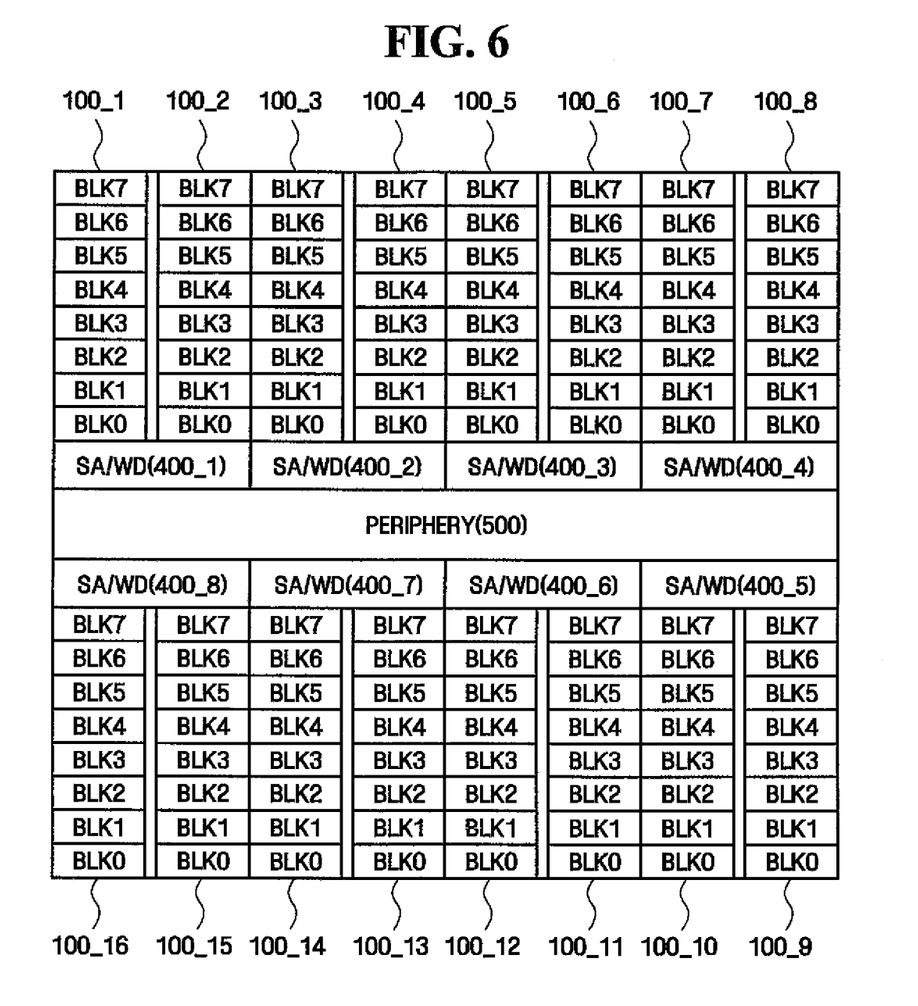
FIG. 6 is a block diagram illustrating the structure of the semiconductor memory device illustrated in FIG. 2.

FIG. 6 is a block diagram illustrating the structure of semiconductor memory device 40 corresponding to first through fourth semiconductor memory devices 40_1 through 40_4 illustrated in FIG. 2.

Referring to FIG. 6, semiconductor memory device 40 comprises a plurality of memory banks 100_1 through 100_16, a plurality of write/read circuits 400_1 through 400_8, and a peripheral circuit region 500.

Each of memory banks 100_1 through 100_16 comprises a plurality of memory blocks BLK0 through BLK7, and each of memory blocks BLK0 through BLK7 comprises a plurality of PRAM cells arranged in a matrix. Each of memory banks 100_1 through 100_16 is illustrated as comprising 8 memory blocks in FIG. 16; however, the number of memory blocks could be modified without departing from the scope of the invention.

Although not elaborately illustrated in FIG. 6, row decoder 310 and column decoder 320 illustrated in FIG. 2 may be provided in peripheral circuit region 500 for memory banks 100_1 through 100_16. Row decoder 310 and column decoder 320 respectively select a row and column of PRAM cells and thus determine a PRAM cell to/from which data is to be written/read.

In the example of FIG. 6, each of write/read circuits 400_1 through 400_8 corresponds to two memory banks and performs a write operation and a read operation on the two memory banks. In other embodiments, each write/read circuit could correspond to a different number of memory banks, e.g., one or four.

In at least one embodiment, peripheral circuit region 500 includes row decoder 310, column decoder 320, a plurality of logic circuit blocks, a voltage generation module, and interface module 200.

Figure 7:
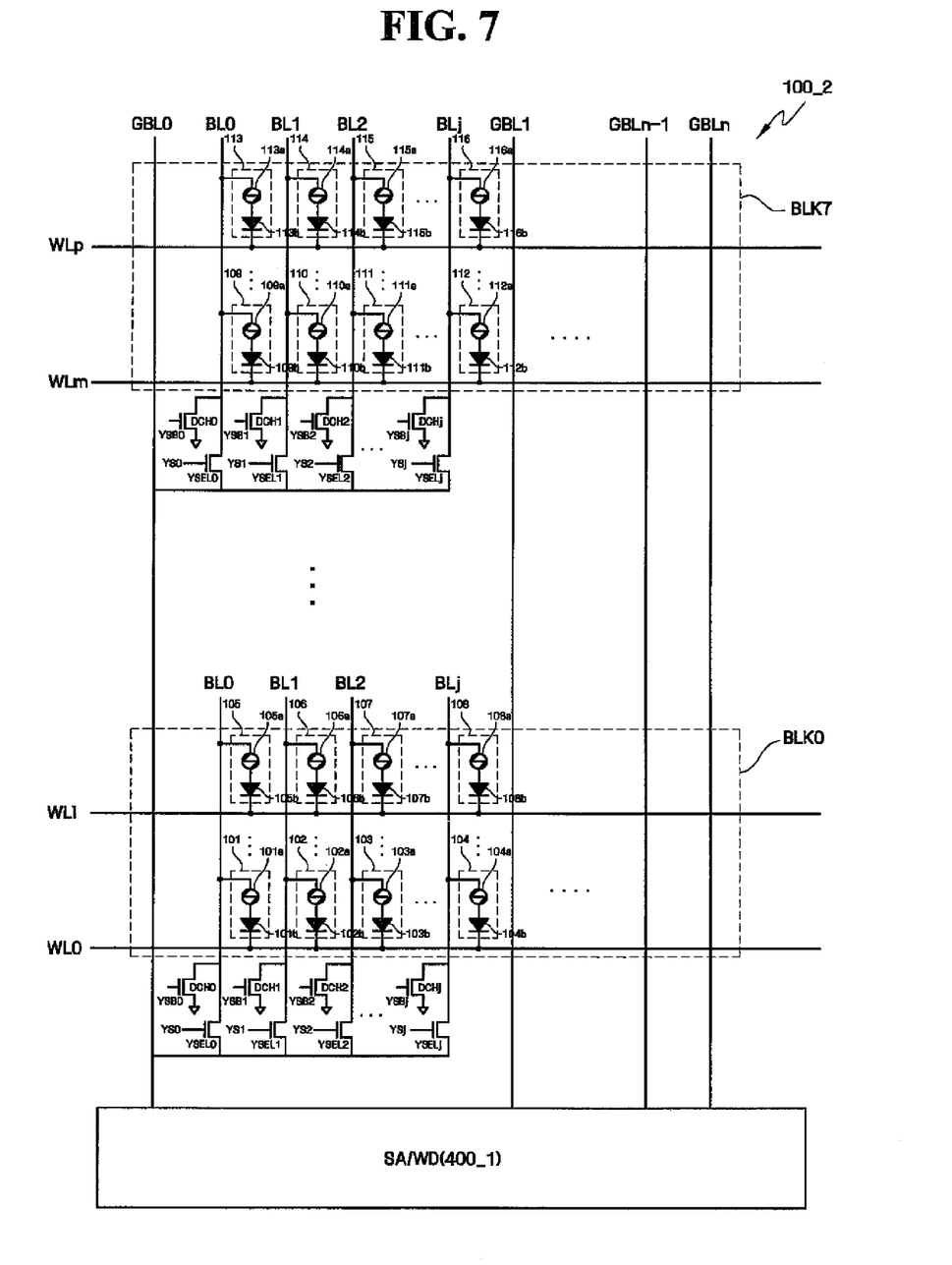
FIG. 7 is a circuit diagram of a memory bank illustrated in FIG. 6.

FIG. 7 is a circuit diagram of memory bank 100_2 illustrated in FIG. 6. This circuit diagram is also indicative of one way to implement other memory banks shown in FIG. 6.

Referring to FIG. 7, memory cell array 100_2 comprises a plurality of memory blocks BLK0 through BLK7, a plurality of global bitlines GBL0 through GBLn, a plurality of local bitlines BL0 through BLj, a plurality of column selection transistors YSEL0 through YSELj, and a plurality of discharge transistors DCH0 through DCHj.

Each of memory blocks BLK0 through BLK7 comprises a plurality of PRAM cells 101 through 116. PRAM cells 101 through 104 are located at intersections between wordline WL0 and local bitlines BL0 through BLj, respectively; PRAM cells 105 through 108 are located at intersections between wordline WL1 and local bitlines BL0 through BLj, respectively; PRAM cells 109 through 112 are located at intersections between wordline WLm and local bitlines BL0 through BLj; and PRAM cells 113 through 116 are located at the intersections between wordline WLp and local bitlines BL0 through BLj, respectively. Global bitlines GBL0 through GBLn and local bitlines BL0 through BLj form a hierarchical bitline structure.

PRAM cells 101 through 116 comprise variable resistor devices 101a through 116a, respectively, and access devices 101b through 116b, respectively. Each of access devices 101b through 116b controls current flows to the corresponding variable resistor device. Each of variable resistor devices 101a through 104a is connected between a local bitline and the corresponding access device. Respective anodes of access devices 101b through 116b are respectively connected to variable resistor devices 101a through 116a. Respective cathodes of access devices 101b through 116b use diodes connected corresponding wordlines. The locations of variable resistor devices 101a through 116a and access devices 101b through 116b may vary.

Column selection transistors YSEL0 through YSELj selectively connect global bit lines GBL0 through GBLn to local bitlines BL0 through BLj in response to column selection signals YS0 through YSj, respectively. Column selection signals YS0 through YSj may be provided by the column decoder 320 illustrated in FIG. 2

Discharge transistors DCH0 through DCHj respectively discharge the voltages of local bitlines BL0 through BLj before and after either a write operation or a read operation. Discharge transistors DCH0 through DCHj are respectively located between local bitlines BL0 through BLj and ground, and discharge corresponding local bitlines BL0 through BLj in response to complementary column selection signals YSB0 through YSBj. Thus, discharge transistors DCH0 through DCHj are turned on when column selection transistors YSEL0 through YSELj are turned off.

Methods of writing/reading data to/from a memory cell array using PRAM command signal, PRAM address signal, and/or PRAM data signal provided by an interface module are described in further detail below with reference to FIGS. 8 through 10.

Figure 8:
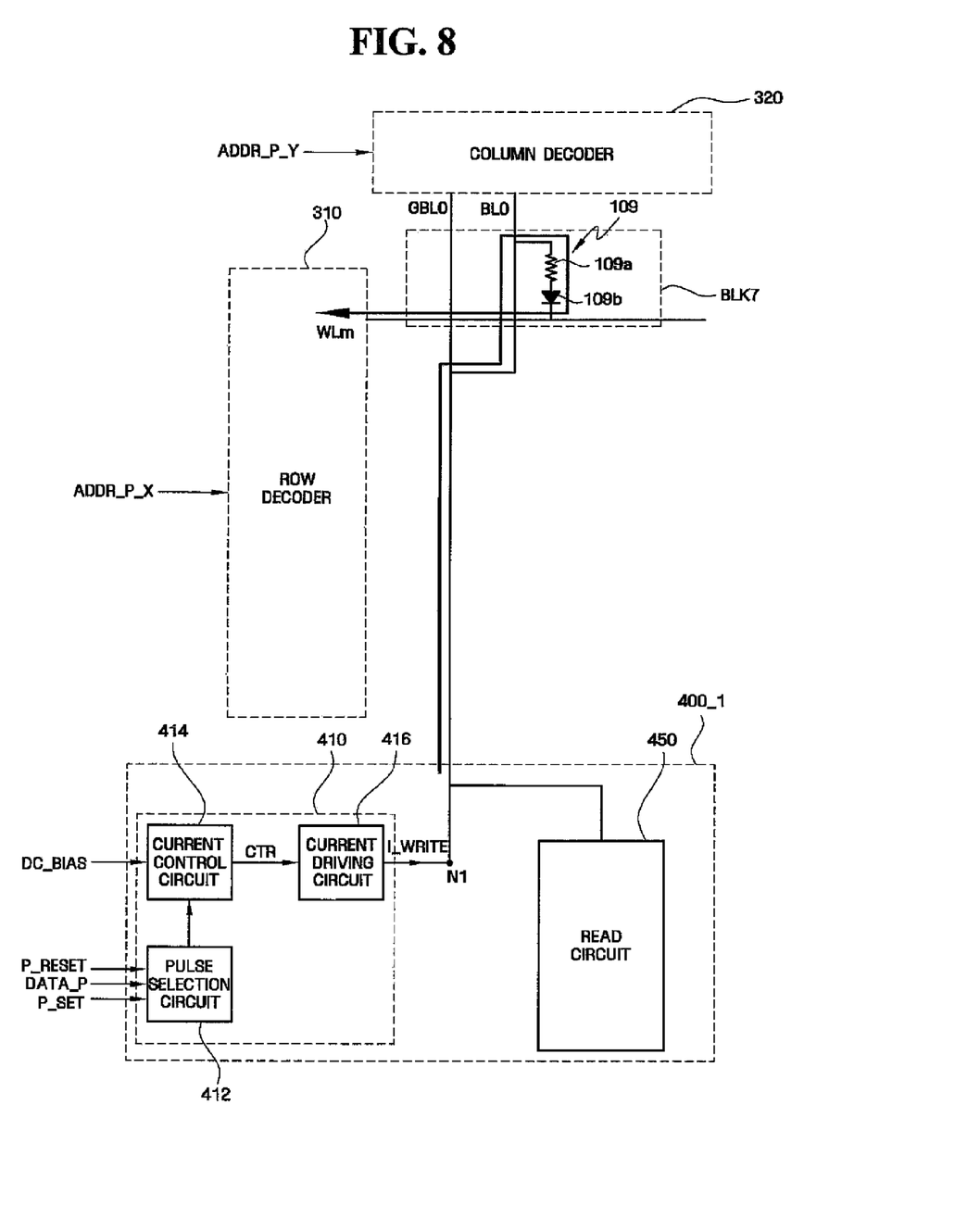
FIG. 8 is a circuit diagram for explaining a write operation performed by the semiconductor memory device illustrated in FIG. 6.

FIG. 8 is a circuit diagram for explaining a write operation performed by the semiconductor memory device illustrated in FIG. 6. For simplicity of illustration, the write operation is explained with reference to a single PRAM cell 109. However, the explanation could also apply to other PRAM cells illustrated in FIG. 7.

Referring to FIG. 8, row decoder 310 selects wordline WLm in response to a PRAM row address signal ADDR_P_X, and column decoder 320 selects local bitline BL0 in response to PRAM column address signal ADDR_P_Y. Accordingly, PRAM cell 109 is selected. Where access device 109b comprises a diode, the diode can be turned on by setting wordline WLm to a logic level "low".

Data can be written to PRAM cell 109 using joule heat generated by applying a write current I_WRITE to variable resistor device 109a containing a phase change material. To illustrate this principle, FIG. 9 is a timing diagram illustrating how time and a temperature applied to a phase change material are used to program PRAM cell 109.

Figure 9:
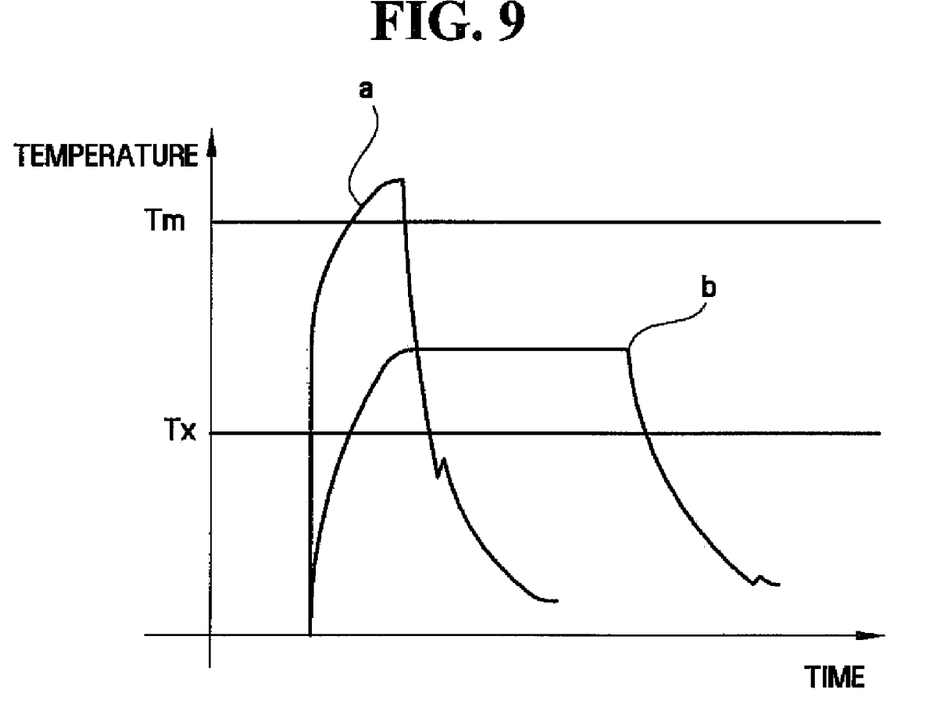
FIG. 9 is a temperature diagram for illustrating phase change characteristics of a PRAM cell.

Referring to FIG. 9, a first curve 'a' shows a time/temperature combination used to place PRAM cell 109 in the amorphous state, and a second curve 'b' shows a time/temperature combination used to place PRAM cell 109 in the crystalline state.

As shown in curve 'a', the phase change material is heated above a melting point "Tm" and then quickly cooled to change it to the amorphous state. As shown in curve 'b', the phase change material is heated to an intermediate temperature between melting point "Tm" and a crystallization temperature "Tx" for a predetermined amount of time, and then cooled to change it to the crystalline state. In FIG. 9, melting point "Tm" is set to 610° C. and crystalline temperature "Tx" is set to 450° C. However, these temperatures can be varied within reasonable ranges and still perform their desired function.

Referring again to FIG. 8, a write circuit 410 comprises a pulse selection circuit 412, a current control circuit 414, and a current driving circuit 416. Pulse selection circuit 412 selectively transmits a reset pulse P_RESET or a set pulse P_SET to current control circuit 314 to write a logical "1" or "0" to PRAM cell 109. Pulse selection circuit 412 transmits to current control circuit 314 whichever of reset pulse P_RESET and set pulse P_SET corresponds to a logic level of PRAM data DATA_P provided by data buffer 240, and provides delayed PRAM data DATA_P obtained by delaying PRAM data DATA_P for a predetermined amount of time. Here, reset pulse P_RESET and set pulse P_SET are current pulses, and the duration of reset pulse P_RESET is shorter than the duration of set pulse P_SET.

Current control circuit 414 controls the amount of current to be supplied to current driving circuit 416 during the duration of reset pulse P_RESET or set pulse P_SET. Current control circuit 414 operates stably if it is supplied with a uniform bias voltage DC_BIAS. Also, if PRAM data DATA_P provided by pulse selection circuit 412 has a first logic level, then current control circuit 414 may output a control signal CTR having a second logic level during the duration of reset pulse P_RESET. On the other hand, if PRAM data DATA_P has the second logic level, then current control circuit 414 may output a control signal CTR having the first logic level during the duration of set pulse P_SET.

Current driving circuit 416 outputs write current I_WRITE to PRAM cell 109 via an output node N1 in response to control signal CTR output by current control circuit 414 during the duration of either reset pulse P_RESET or set pulse P_SET. Current driving circuit 416 discharges output node N1 when either reset pulse P_RESET or set pulse P_SET is not enabled.

Where write current I_WRITE is applied to variable resistor device 109a of PRAM cell 109, joule heat that is generated and the state of variable resistor device 109a is changed into the amorphous state corresponding to logic level "1" or the crystalline state corresponding to logic level "0" due to the joule heat, thus writing PRAM data DATA_P to PRAM cell 109.

A read operation of a semiconductor memory device is described below with reference to FIG. 10. In particular, FIG. 10 is a circuit diagram for explaining a read operation performed by the semiconductor memory device illustrated in FIG. 6. To avoid redundant explanation, only PRAM cell 109 among PRAM cells 109 through 116 in eighth memory block BLK7 of FIG. 7 is described. Other PRAM cells illustrated in FIG. 7 function similarly to PRAM cell 109.

Figure 10:
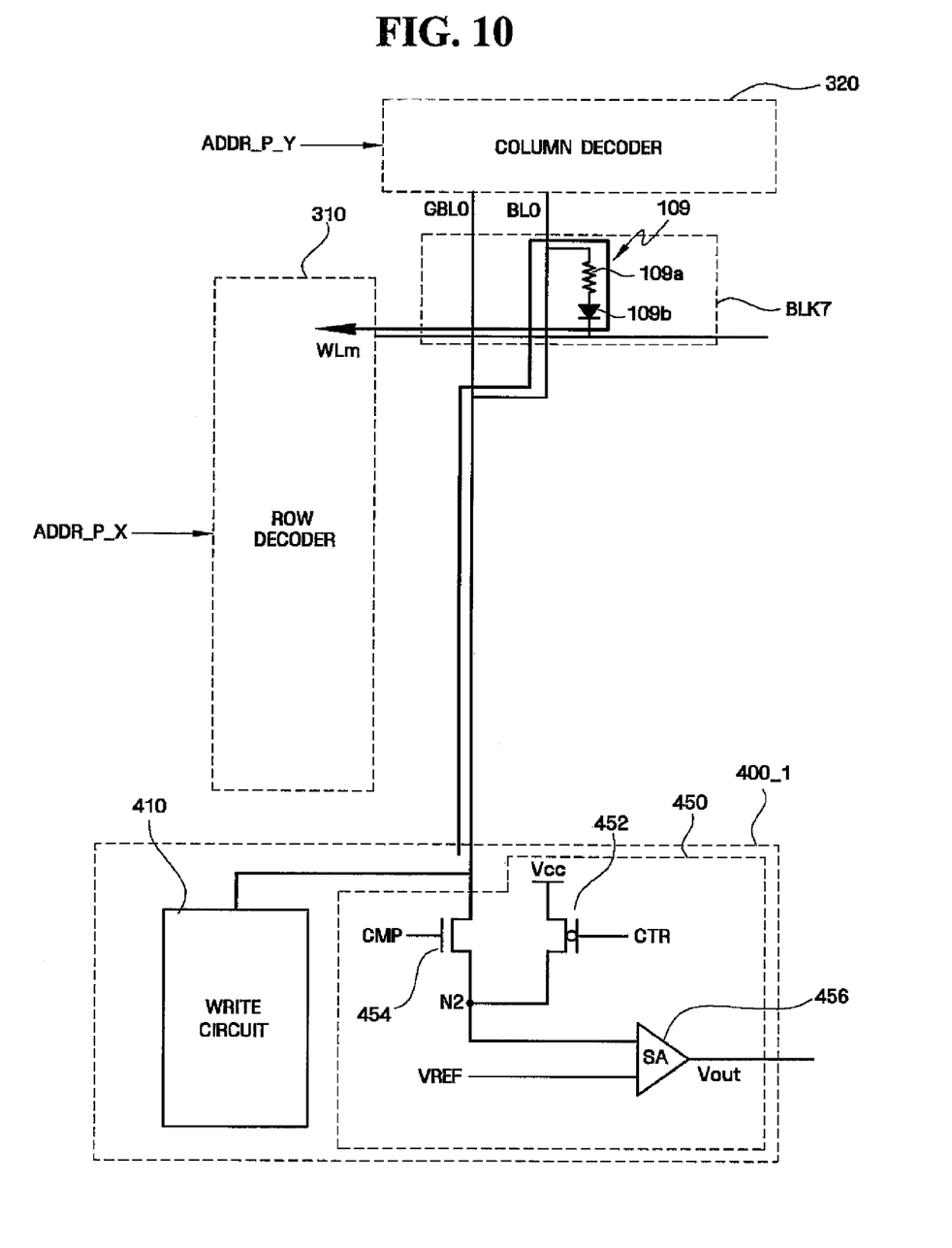
FIG. 10 is a circuit diagram for explaining a read operation performed by the semiconductor memory device illustrated in FIG. 6.

Referring to FIG. 10, before the read operation, a precharge transistor 452 is turned on. As a result, a sensing node N2 is precharged to a power supply voltage.

Thereafter, row decoder 310 selects wordline WL0 or WLm in response to PRAM row address signal ADDR_P_X, and column decoder 320 selects local bitline BL0 in response to PRAM column address signal ADDR_P_Y. Accordingly, PRAM cell 109 is selected. Once the read operation is initiated in response to a read command, precharge transistor 452 is turned off, thereby terminating the precharge operation.

Where a clamp control signal CMP having a predetermined voltage is applied to the gate of a clamp transistor 454, clamp transistor 454 clamps a global bitline GBL0 to a predetermined voltage that is not higher than a threshold voltage Vth because, when a voltage higher than threshold voltage Vth is applied to PRAM cell 109, the phase of the phase change material in variable resistor device 109a will change.

As a result of the clamping performed by clamp transistor 454, a read current I_READ is applied to PRAM cell 109, and a current passing through PRAM cell 109 is generated according to the resistance of the phase change material of variable resistor device 109a.

Once the current is generated through PRAM cell 109, the voltage level of sensing node N2 varies. Accordingly, a sense amplifier 456 compares the voltage of sensing node N2 with a reference voltage VREF, and reads a logic level of PRAM cell 109 based on the comparison.

A semiconductor memory device according to selected embodiments of the invention can perform a write operation or a read operation in connection with a DRAM controller, an SRAM controller, a DEMUX NOR flash controller, a MUX NOR flash controller, or a NAND flash controller using an interface module providing a unified interface function to convert a set of signals provided by any type of controller into a set of PRAM signals. Accordingly, various types of semiconductor memory devices can be replaced with a single PRAM device, thereby improving the operating speed and reliability of the semiconductor memory devices.

Figure 11:
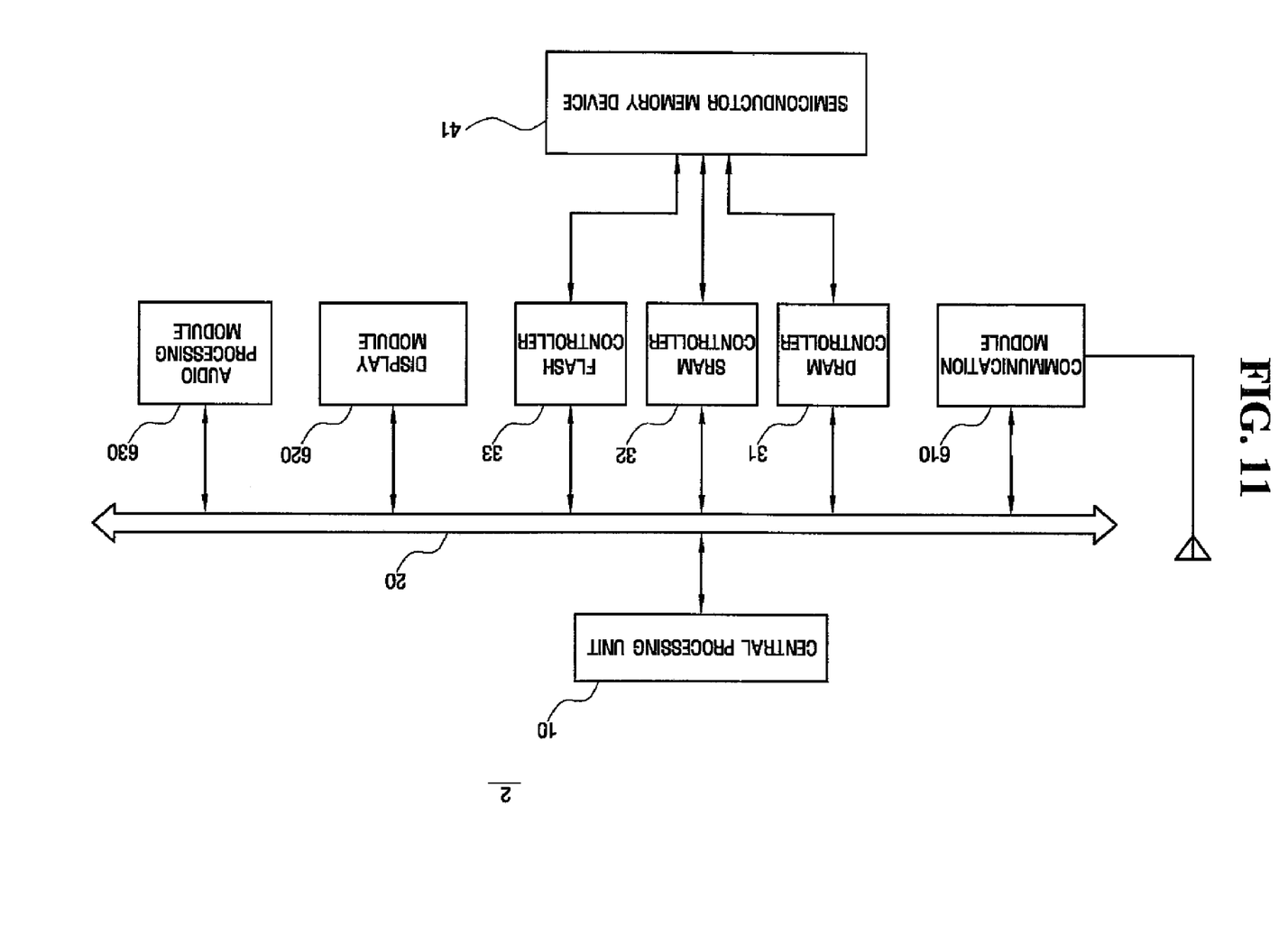
FIG. 11 is a block diagram of a memory system according to another embodiment of the present invention.

FIG. 11 is a block diagram of a memory system 2 according to another embodiment of the present invention. As examples, memory system 2 could comprise a portable media system such as a portable telephone.

Referring to FIG. 11, memory system 2 comprises a communication module 610, a central processing unit 10, a display module 620, an audio processing module 630, and a semiconductor memory device 41 corresponding to a plurality of controllers, including a DRAM controller 31, an SRAM controller 32, and a flash memory controller 33.

Communication module 610 transmits audio/video (A/V) data to or receives A/V data from, for example, a base station. Communication module 610 typically transmits/receives A/V data using a protocol such as Code Division Multiple Access (CDMA), Global System for Mobile communication (GSM), North 20 American Digital Cellular (NADC), Time Division Multiple Access (TDMA), Extended TDMA (ETDMA), third-generation Wideband CDMA (WCDMA), or CDMA-2000.

Central processing unit 10 controls A/V data communication, user input, screen display, and A/V output. Central processing unit 10 controls controllers 31 through 33, semiconductor memory device 41, communication module 610, display module 620, and audio processing module 630 via a system bus 20. Semiconductor memory device 41 comprises a memory cell array (not shown) comprising a plurality of PRAM cells, an interface module (not shown) providing a unified interface function, and a write/read circuit module (not shown) performing a write/read operation.

In the example of FIG. 11, semiconductor memory device 41 comprises a unified interface module and performs its operations by receiving a command signal, an address signal, and a data signal from each of controllers 31, 32, and 33. The memory cell array of semiconductor memory device 41 is divided into first through n-th memory regions that are respectively driven in connection with first through n-th controllers.

Display module 620 displays various images under the control of central processing unit 10.

Since semiconductor memory device 41 has a unified interface function, the operating speed and reliability of a portable media system including semiconductor memory device 41 may be improved relative to conventional devices.

As described above, semiconductor memory devices according to selected embodiments of the invention tend to have several advantages over conventional devices. For example, the operating speed and reliability of the semiconductor memory devices and memory systems including the semiconductor memory devices may be improved by the replacement of SRAMs, DRAMs, or flash memories with PRAMs. In addition, the cost of developing memory products may be reduced by replacing SRAMs, DRAMs, and flash memories with a single type of chip.

The foregoing exemplary embodiments are teaching examples. Those of ordinary skill in the art will understand that various changes in form and details may be made to the exemplary embodiments without departing from the scope of the invention as defined by the following claims.s

What is claimed:

1. A semiconductor memory device, comprising:
   a memory cell array comprising a plurality of first-type memory cells;
   an interface module receiving a second-type command signal, a second-type address signal, and a second-type data signal associated with a different semiconductor memory device comprising a plurality of second-type memory cells, and respectively converting the second-type command signal, the second-type address signal, and the second-type data signal into a first-type command signal, a first-type address signal, and a first-type data signal suitable for operating the memory cell array,
   wherein the interface module comprises
      a mode selector providing an interface mode signal corresponding to the second-type command signal;
      a command converter converting the second-type command signal into a first-type command signal comprising first through third control signals in response to the interface mode signal;
      an address-data demultiplexer selectively demultiplexing the second-type address signal and the second-type data signal in response to the first control signal;
      an address buffer converting the second-type address signal into the first-type address signal by buffering the second-type address signal in response to the second control signal; and
      a data buffer converting the second-type data signal into the first-type data signal by buffering the second-type data signal in response to the third control signal; and
   a write/read circuit module writing data to or reading data from the memory cell array using the first-type command signal, the first-type address signal, and the first-type data signal.

2. A semiconductor memory device, comprising:
   a memory cell array comprising a plurality of first-type memory cells;
   an interface module receiving a second-type command signal, a second-type address signal, and a second-type data signal associated with a different semiconductor memory device comprising a plurality of second-type memory cells, and respectively converting the second-type command signal, the second-type address signal, and the second-type data signal into a first-type command signal, a first-type address signal, and a first-type data signal suitable for operating the memory cell array, and
   a write/read circuit module writing data to or reading data from the memory cell array using the first-type command signal, the first-type address signal, and the first-type data signal,
   wherein the second-type address signal and the second-type data signal are multiplexed together; and
   the interface module receives and demultiplexes the second-type address signal and the second-type data signal, and converts the demultiplexed second-type address signal and the demultiplexed second-type data signal into the first-type address signal and the first-type data signal, respectively, by buffering the demultiplexed second-type address signal and the demultiplexed second-type data signal.

3. The semiconductor memory device of claim 1, wherein the interface module converts the second-type address signal and the second-type data signal into the first-type address signal and the first-type data signal by buffering the second-type address signal and the second-type data signal.

4. The semiconductor memory device of claim 1, wherein the second-type address signal comprises a second-type row address signal and a second-type column address signal multiplexed together and the first-type address signal comprises a first-type row address signal and a first-type column address signal; and
   wherein the interface module receives and demultiplexes the second-type address signal and converts the demultiplexed second-type address signal into the first-type address signal by buffering the second row address signal and the second column address signal.

5. The semiconductor memory device of claim 1, wherein the first-type memory cells are phase change random access memory (PRAM) cells, and the second-type memory cells are dynamic random access memory (DRAM) cells, static random access memory (SRAM) cells, or flash memory cells.

6. A memory system, comprising:
   first through m-th controllers, among which is an n-th controller ($1 \leq n \leq m$), the n-th controller providing a second-type command signal, a second-type address signal, and a second-type data signal that are suitable for operating a semiconductor memory device comprising a plurality of second-type memory cells; and
   first through m-th semiconductor memory devices respectively corresponding to the first through m-th controllers, among which is an n-th semiconductor memory device corresponding to the n-th controller, the n-th semiconductor memory device operating in response to the second-type command signal, the second-type address signal, and the second-type data signal;
   wherein the n-th semiconductor memory device comprises:
   a memory cell array comprising a plurality of first-type memory cells;

an interface module receiving the second-type command signal, the second-type address signal, and the second-type data signal and respectively converting the second-type command signal, the second-type address signal, and the second-type data signal into a first-type command signal, a first-type address signal, and a first-type data signal that are suitable for operating a semiconductor memory device comprising the first-type memory cells; and a write/read circuit module writing data to or reading data from the memory cell array using the first-type command signal, the first-type address signal, and the first-type data signal.

7. The semiconductor memory device of claim 6, wherein the second-type address signal and the second-type data signal are multiplexed together; and wherein the interface module receives and demultiplexes the second-type address signal and the second-type data signal, and converts the demultiplexed second-type address signal and the demultiplexed second-type data signal into the first-type address signal and the first-type data signal, respectively, by buffering the demultiplexed second-type address signal and the demultiplexed second-type data signal.

8. The semiconductor memory device of claim 6, wherein the interface module converts the second-type address signal and the second-type data signal into the first-type address signal and the first-type data signal by buffering the second-type address signal and the second-type data signal.

9. The semiconductor memory device of claim 6, wherein the second-type address signal comprises a second-type row address signal and a second-type column address signal multiplexed together and the first-type address signal comprises a first-type row address signal and a first-type column address signal; and wherein the interface module receives and demultiplexes the second-type address signal and converts the demultiplexed second-type address signal into the first-type address signal by buffering the second row address signal and the second column address signal.

10. The semiconductor memory device of claim 6, wherein the first-type memory cells are phase change random access memory (PRAM) cells, and the second-type memory cells are dynamic random access memory (DRAM) cells, static random access memory (SRAM) cells, or flash memory cells.

11. The semiconductor memory device of claim 6, wherein the interface module comprises:

a mode selector providing an interface mode signal corresponding to the second-type command signal;

a command converter converting the second-type command signal into a first-type command signal comprising first through third control signals in response to the interface mode signal;

an address-data demultiplexer selectively demultiplexing the second-type address signal and the second-type data signal in response to the first control signal;

an address buffer converting the second-type address signal into the first-type address signal by buffering the second-type address signal in response to the second control signal; and a data buffer converting the second-type data signal into the first-type data signal by buffering the second-type data signal in response to the third control signal.

12. The memory system of claim 11, wherein the second-type command signal is suitable for operating a semiconductor memory device comprising a plurality of dynamic random access memory (DRAM) cells;

wherein the second-type address signal comprises a second-type row address signal and a second-type column address signal multiplexed together and the first-type address signal comprises a first-type row address signal and a first-type column address signal;

wherein the address-data demultiplexer transmits the second-type address signal and the second-type data signal to the address buffer and the data buffer, respectively, in response to the first control signal; and wherein the address buffer demultiplexes the second-type address signal and converts the demultiplexed second-type address signal into the first-type address signal by buffering the second-type row address signal and the second-type column address signal in response to the second control signal.

13. The memory system of claim 11, wherein the second-type command signal is suitable for operating a semiconductor memory device comprising a plurality of MUX NOR flash memory cells;

wherein the second-type address signal and the second-type data signal are multiplexed together; and wherein the address-data demultiplexer demultiplexes the second-type address signal and the second-type data signal in response to the first control signal.

14. The memory system of claim 11, wherein the second-type command signal is suitable for operating a semiconductor memory device comprising a plurality of DEMUX NOR flash memory cells; and wherein the address-data demultiplexer transmits the second-type address signal and the second-type data signal to the address buffer and the data buffer, respectively, in response to the first control signal.

15. The memory system of claim 11, wherein the second-type command signal is suitable for operating a semiconductor memory device comprising a plurality of static random access memory (SRAM) cells; and wherein the address-data demultiplexer transmits the second-type address signal and the second-type data signal to the address buffer and the data buffer, respectively, in response to the first control signal.

* * * * *